(12) United States Patent
Zhou et al.

(10) Patent No.: US 11,248,290 B2
(45) Date of Patent: Feb. 15, 2022

(54) MASK, FILM FORMING METHOD USING THE SAME, AND FILM FORMING APPARATUS

(71) Applicants: BOE TECHNOLOGY GROUP CO., LTD., Beijing (CN); CHENGDU BOE OPTOELECTRONICS TECHNOLOGY CO., LTD., Sichuan (CN)

(72) Inventors: Zhenli Zhou, Beijing (CN); Zi Qiao, Beijing (CN); Zhiliang Jiang, Beijing (CN)

(73) Assignees: BOE TECHNOLOGY GROUP CO., LTD., Beijing (CN); CHENGDU BOE OPTOELECTRONICS TECHNOLOGY CO., LTD., Sichuan (CN)

( * ) Notice: Subject to any disclaimer, the term of this patent is extended or adjusted under 35 U.S.C. 154(b) by 226 days.

(21) Appl. No.: 16/141,815

(22) Filed: Sep. 25, 2018

(65) Prior Publication Data

US 2019/0093216 A1   Mar. 28, 2019

(30) Foreign Application Priority Data

Sep. 26, 2017   (CN) .......................... 201710887617.3

(51) Int. Cl.
  *C23C 16/04*     (2006.01)
  *H01L 51/00*    (2006.01)
  (Continued)

(52) U.S. Cl.
  CPC .......... *C23C 16/042* (2013.01); *C23C 14/042* (2013.01); *H01L 51/56* (2013.01); *H01L 51/0011* (2013.01)

(58) Field of Classification Search
  CPC ... C23C 14/042; C23C 16/045; C23C 16/042; C23C 14/04; C23C 14/044; C23C 16/04; H05B 33/10; H01L 51/0011
  (Continued)

(56) References Cited

U.S. PATENT DOCUMENTS

2012/0060756 A1*  3/2012  Ookawara ............. C23C 14/042
                                                    118/504
2014/0150721 A1*  6/2014  Oh ....................... H01L 51/0011
                                                    118/504
(Continued)

FOREIGN PATENT DOCUMENTS

CN    103589995 A    2/2014
CN    106521412 A    3/2017

OTHER PUBLICATIONS

Chinese First Office Action issued in corresponding Chinese Patent Application No. 201710887617.3, dated Apr. 1, 2019; with English translation.

*Primary Examiner* — Aiden Lee
(74) *Attorney, Agent, or Firm* — McDermott Will & Emery LLP

(57) ABSTRACT

A mask includes a shielding portion and a plurality of hollow regions. The shielding portion includes: a plurality of shielding strips, a plurality of raised portions and a plurality of grooves. Side surfaces of some of the plurality of shielding strips are sequentially connected to form one of the plurality of hollow regions. Each raised portion is disposed on a side surface of a corresponding one of the plurality of shielding strips close to a corresponding hollow region, and each raised portion is connected with the side surface of the shielding strip. Each groove is at least partially formed in a first surface of a corresponding one of the plurality of raised portions, and the first surface is parallel to a plate surface of the mask.

10 Claims, 7 Drawing Sheets

(51) Int. Cl.
*H01L 51/56* (2006.01)
*C23C 14/04* (2006.01)

(58) Field of Classification Search
USPC .................................................. 118/720, 721
See application file for complete search history.

(56) References Cited

U.S. PATENT DOCUMENTS

| | | | |
|---|---|---|---|
| 2015/0007768 A1* | 1/2015 | Lee ....................... | B05C 21/005 |
| | | | 118/504 |
| 2017/0222145 A1* | 8/2017 | Kim ................... | H01L 51/0011 |
| 2018/0155818 A1* | 6/2018 | Mu ........................ | C23C 14/12 |
| 2019/0203336 A1* | 7/2019 | Xu ........................ | C23C 14/042 |
| 2019/0242012 A1* | 8/2019 | Wang .................... | C23C 16/042 |
| 2019/0368028 A1* | 12/2019 | Yamabuchi ............. | C23C 14/24 |
| 2020/0144530 A1* | 5/2020 | Kim ................... | H01L 51/5056 |

* cited by examiner

MASK, FILM FORMING METHOD USING THE SAME, AND FILM FORMING APPARATUS

CROSS-REFERENCE TO RELATED APPLICATION

This application claims priority to Chinese Patent Application No. 201710887617.3, filed on Sep. 26, 2017, titled "A MASK, FILM FORMING METHOD USING THE SAME, AND FILM FORMING APPARATUS", which is incorporated herein by reference in its entirety.

TECHNICAL FIELD

The present disclosure relates to the field of display technologies, and more particularly to a mask, a film forming method using the same and a film forming apparatus.

BACKGROUND

Organic light emitting diode (OLED) displays have been widely applied to various electronic apparatuses including computers, mobile phones, etc., due to their advantages of self-illumination, lightweight, low power consumption, high contrast, high color gamut, flexible display, etc.

SUMMARY

In a first aspect, a mask is provided, and the mask includes a shielding portion and a plurality of hollow regions. The shielding portion includes: a plurality of shielding strips which intersect, wherein side surfaces of some of the plurality of shielding strips are sequentially connected to form one of the plurality of hollow regions; a plurality of raised portions, wherein each raised portion is disposed on a side surface of a corresponding one of the plurality of shielding strips close to a corresponding hollow region, and each raised portion is connected with the side surface of the corresponding one of the plurality of shielding strips; and a plurality of grooves, wherein each groove is at least partially formed in a first surface of a corresponding one of the plurality of raised portions. The first surface is parallel to a plate surface of the mask.

In some embodiments, each of the plurality of raised portions and each of the plurality of grooves both have axisymmetric structures, and axes of symmetry of each of the plurality of raised portions and each of the plurality of grooves are coincided with each other.

In some embodiments, axes of symmetry of each of the plurality of raised portions and each of the plurality of grooves are both axisymmetric structures, and axes of symmetry of each of the plurality of raised portions and each of the plurality of grooves are coincided.

In some embodiments, axes of symmetry of each of the plurality of raised portions and each of the plurality of grooves are perpendicular to a side surface of a corresponding one of the plurality of shielding strips connected a corresponding the raised portion.

In some embodiments, a shape of a cross-section of each of the plurality of grooves is one of a circular shape, an elliptical shape, or a polygonal shape, and the cross-section is parallel to the first surface of a corresponding one of the plurality of grooves.

In some embodiments, each of the plurality of raised portions has a bottom configured to form a corresponding one of the plurality of grooves and a plurality of side walls located on sides of the bottom, and a center thickness of the bottom is smaller than a thickness of an edge of the bottom close to the side walls.

In some embodiments, a bottom surface of each of the plurality of grooves is a curved surface.

In some embodiments, a ratio of an area of an orthographic projection of each of the plurality of grooves on a first surface of a corresponding one of the plurality of raised portions to an area of the first surface is between about 1:2 and 4:5.

In some embodiments, the ratio of the area of the orthographic projection of each of the plurality of grooves on the first surface of the corresponding one of the plurality of raised portions to the area of the first surface is about 3:5.

In some embodiments, each of the plurality of raised portions has a bottom configured to form a groove and a plurality of side walls located on sides of the bottom, and a height of the side walls is equal to a thickness of the shielding portion. A ratio of a depth of the groove to the thickness of the shielding portion is between about 2:5 and 9:10, and a height direction of the side walls is parallel to a thickness direction of the shielding portion.

In some embodiments, the ratio of the depth of the groove to the thickness of the shielding portion is about 3:5.

In some embodiments, each of the plurality of raised portion has a bottom configured to form a groove and a plurality of side walls located on sides of the bottom, and a thickness of each of the side walls is larger than or equal to about 0.3 mm.

In some embodiments, the thickness of each of the plurality of side wall is about 0.5 mm.

At another aspect, a film forming method is provided, which includes preparing a thin film on the substrate by using the mask according to the above aspect.

At another aspect, a film forming apparatus is provided, which comprises the mask according to the above aspect.

BRIEF DESCRIPTION OF THE DRAWINGS

In order to describe technical solutions in embodiments of the present disclosure or in the related art more clearly, the accompanying drawings to be used in the description of embodiments or the related art will be introduced briefly. Obviously, the accompanying drawings to be described below are merely some embodiments of the present disclosure, and a person of ordinary skill in the art can obtain other drawings according to those drawings without paying any creative effort.

DETAILED DESCRIPTION

Technical solutions in embodiments of the present disclosure will be described clearly and completely with reference to the accompanying drawings in the embodiments of the present disclosure. Obviously, the described embodiments are merely some but not all of embodiments of the present disclosure. All other embodiments made on the basis of the embodiments of the present disclosure by a person of ordinary skill in the art without paying any creative effort shall be comprised in the protection scope of the present disclosure.

In a process for manufacturing an OLED display, an encapsulation film layer is firstly formed on a motherboard on which a plurality of pixel circuits, each of which includes a plurality of thin film transistors (TFTs) and an OLED device, have been formed, and then the formed whole structure is cut into a plurality of OLED displays.

The encapsulation thin film layer is formed by using for example methods such as vacuum evaporation coating, physical vapor deposition film forming, or chemical vapor deposition film forming, etc. For a film layer which is required to be deposited from a new substance formed by way of chemical reaction during a vapor phase doping process, the chemical vapor deposition film forming method is used. The chemical vapor deposition film forming method is characterized by simple structure of the equipment, mature process and strong adhesion stress of the film layer formed by deposition after reaction. Therefore, in some embodiments of the present disclosure, the encapsulation film layer of the OLED displays is prepared by a chemical vapor deposition method. The design of the mask, and the setting mode and working process of the film forming operation according to some embodiments of the present disclosure is described in detail below by taking the chemical vapor deposition film forming as an example.

A mask is used during the formation of the encapsulation film layer, and the mask has hollow regions corresponding to OLED displays respectively. The film forming material is formed onto the motherboard through the hollow regions, so as to form the encapsulation film layer.

Figure 1:
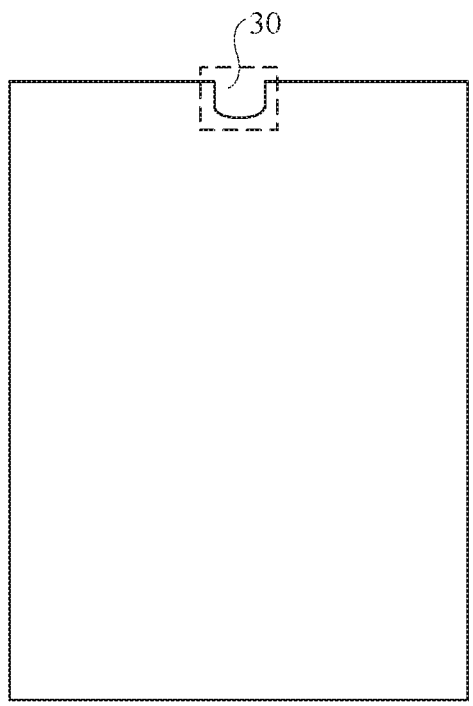
FIG. 1 is a schematic structural diagram of a display panel in accordance with some embodiments of the present disclosure.

In some embodiments, as shown in FIG. 1, a display panel of the encapsulated OLED display has a notch 30 which is used to install auxiliary devices such as a handset, a camera, etc. In order to form the display panel with the notch 30, a mask as shown in FIG. 2 is adopted during the thin film encapsulation process, and the mask includes a shielding portion X and a plurality of hollow regions Y.

Figure 2:
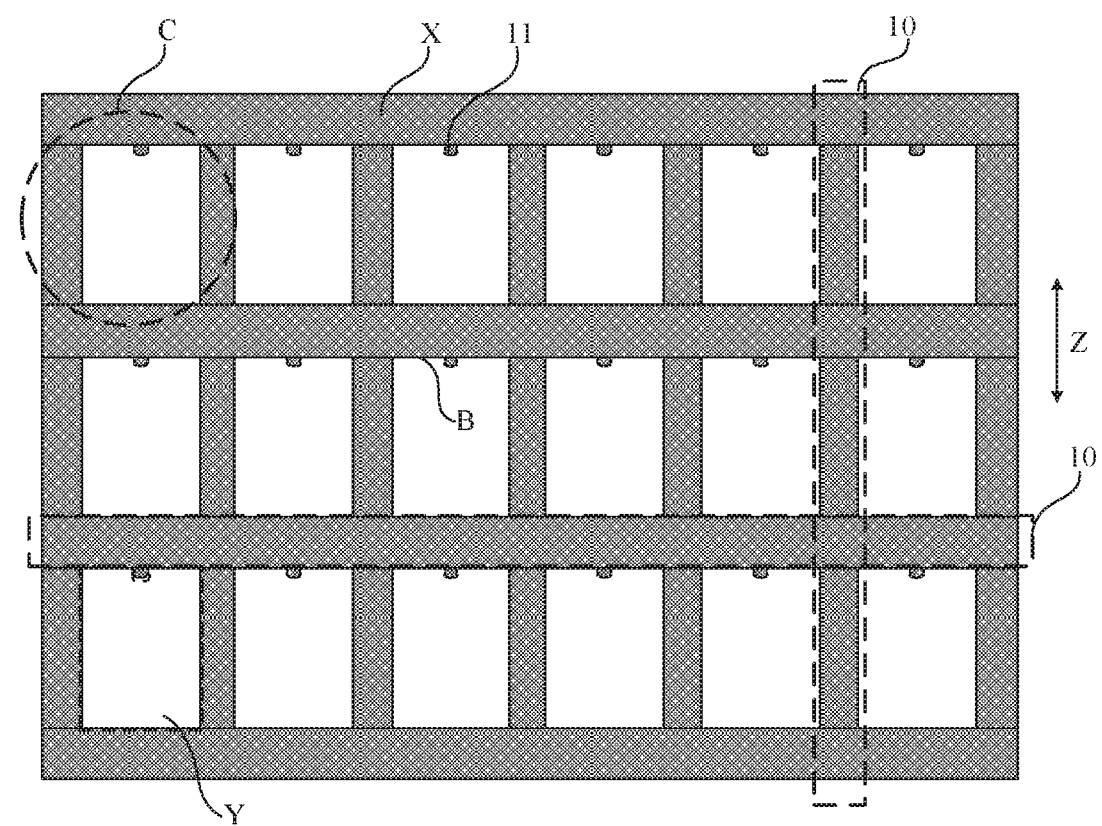
FIG. 2 is a schematic structural diagram of a mask in accordance with some embodiments of the present disclosure.

As shown in FIG. 2, the shielding portion X includes a plurality of shielding strips 10 that intersect, and side surfaces B of some of the plurality of shielding strips 10 are sequentially connected to form one of the plurality of hollow region Y, that is, each hollow region Y is formed by sequentially connecting side surfaces B of some of the plurality of shielding strips 10.

As shown in FIG. 2, the shielding portion X further includes a plurality of raised portions 11. Each raised portion 11 is disposed on a side surface B of a corresponding one of the plurality of shielding strips 10 for defining a corresponding one of the plurality of hollow regions Y, and the raised portion 11 is connected with the side surface B. For example, as shown in FIG. 2, in the region C, the raised portion 11 is disposed on the side surface B at a higher position, and the raised portion 11 is connected with the side surface B. In some embodiments, the raised portion 11 and the shielding strip 10 are in the same layer and of the same material, and are designed as an integral structure.

It will be noted that, the shielding portion X of the mask is an entity part of the mask, and is configured to shield a region of a substrate to be film-formed corresponding to this part in the case where the substrate to be film-formed is under the mask so as to prevent the film forming materials from falling on the region of the substrate to be film-formed. In addition, a shape of a hollow region Y can be determined based on shapes of the shielding strips 10 for defining the hollow region Y, and a corresponding raised portion 11 of the mask, so as to form a pattern that is corresponding to the pattern of the hollow regions Y, on the substrate to be film-formed.

Figure 3:
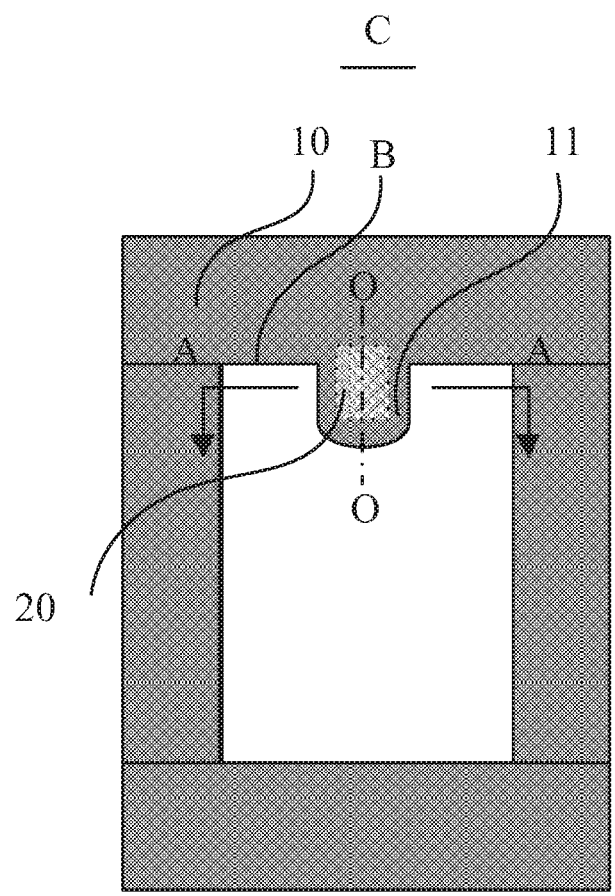
FIG. 3 is a first partial enlarged view of the region C in FIG. 2.

In addition, the positions and the number of the raised portions 11 are not limited in the present disclosure, as long as each of the raised portions 11 is disposed on a side surface B of a corresponding one of the shielding strips 10 for defining the hollow region Y and is connected with the side surface B, and a person skilled in the art can perform a corresponding design according to the pattern to be formed on the substrate to be film-formed. For example, for the touch screen smartphone, as shown in FIG. 3, the raised portion 11 is disposed at the middle of the side surface B of the upper one of the shielding strips 10 for defining the hollow region Y, and is configured to make the finished smartphone has a notch 30 at the upper central position of the display area, so as to install a camera or a handset at the position of the notch 30.

The raised portion 11 is configured to shield the film-forming material, so as to prevent the film-forming material from depositing on a region of the substrate to be film-formed corresponding to the notch 30.

In the manufacturing field of the OLED display, the mask is for example a metal mask. In this case, the metal mask is welded to an outer frame for carrying the mask after being stretched by a stretcher, so as to be attached to the substrate to be film-formed (for example, the motherboard on which a plurality of pixel circuits have been formed).

However, after the mask is stretched, since the drawing force imposed on the raised portion 11 of the mask is nonuniform, the mask is generally raised at the position of the raised position 11, so that the gap between the raised portion 11 and the substrate to be film-formed is larger. Therefore, the amount of the ionic substance formed through the reaction entering into the gap is larger. In this way, at one aspect, the design of the frame of the product will be greatly and uncertainly affected, and at another aspect, the formed film layer will have worse encapsulation reliability to the OLED display after being cut.

In order to solve the above problem, in some embodiments, as shown in FIG. 3, the mask further includes a plurality of grooves 20 each of which is at least partially formed in a first surface of a corresponding one of the plurality of raised portions 11.

The grooves 20 are formed via for example partial etching process during the process of manufacturing the mask.

It will be noted that, the first surface of the raised portion 11 is parallel to plate surfaces of the mask. The plate surfaces of the mask are parallel to a surface of a film to be formed on the substrate to be film-formed, and include a lower surface of the mask close to the substrate to be film-formed, and an upper surface of the mask facing away from the substrate to be film-formed. In some embodiments, the first surface of the raised portion 11 is on the same level with the upper surface or the lower surface of the mask.

Before the film forming process is performed by using the mask, the plate surface of the mask in which the grooves are formed is placed to face the substrate to be film-formed, and is tightly attached to the substrate to be film-formed. For illustration purposes, the following embodiments are described by taking the first surface of the raised portion 11 and the lower surface of the mask being in the same plane as an example.

In addition, the description that the groove 20 is at least partially formed in the first surface of the raised portion 11 refers to that the groove 20 is completely formed in the first surface of the raised portion 11, or as shown in FIG. 3, a portion of the groove 20 is formed in the first surface of the raised portion 11, and the remaining portion is formed in a surface of the shielding strip 10 connected with and parallel to the first surface of the raised portion 11. In some embodiments, the groove 20 is partially formed in the first surface of the raised portion 11, and in this case, most of the groove 20 is formed in the first surface of the raised portion 11. For example, as shown in FIG. 3, most of the groove 20 is formed in the first surface of the raised portion 11, and a remaining small portion is formed in the surface of the shielding strip 10.

Figure 4:
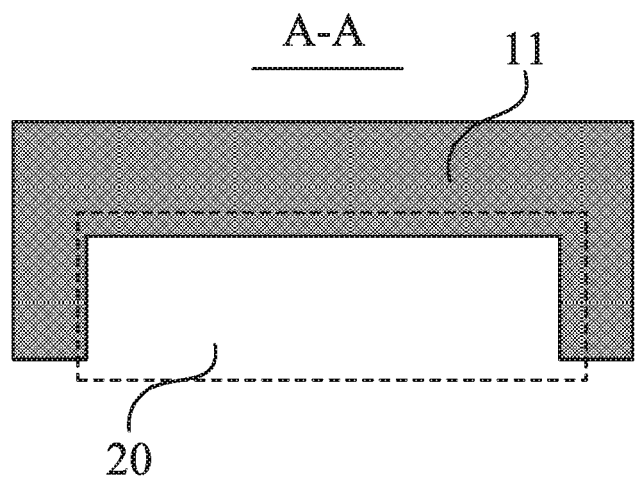
FIG. 4 is a section view of the raised portion along line A-A in FIG. 3.

FIG. 4 shows a structure obtained by sectioning the raised portion 11 having the groove 20 thereon along the line A-A in FIG. 3.

The mask provided by the embodiments of the present disclosure includes a shielding portion X and hollow regions Y, and the shielding portion X includes the shielding strips 10 and the raised portions 11. In addition, the mask includes grooves each of which is at least partially formed in the first surface of the corresponding raised portion 11, In this case, in the process of stretching the mask through the stretcher, the groove 20 may adjust the drawing force imposed on the mask when the mask is stretched toward two opposite sides, so that when the adjusted drawing force is applied to the raised portion 11, the force is transferred to the edges of the raised portion 11 so that the edges of the raised portion 11 may bend toward a side where the groove 20 is located. The edges of the bended raised portion 11 may reduce the gap distance between the raised portion 11 and the substrate to be film-formed, thereby reducing the scope of the film-forming material at the position of the substrate to be film-formed corresponding to the edge of the raised portion 11 during a film-forming operation is performed on the substrate to be film-formed. Therefore, the correspondence consistency between the mask pattern of the mask and the formed film layer pattern are improved, and the encapsulation reliability of the OLED display is enhanced.

In some embodiments, as shown in FIG. 3, the structures of the raised portion 11 and the groove 20 are both axisymmetric, and the axes of symmetry of the raised portion 11 and the groove 20 are coincide, which are both O-O.

In addition, axes of symmetry of each of the plurality of raised portions 11 and each of the plurality of grooves 20 are perpendicular to a side surface B of a corresponding one of the plurality of shielding strips 10 connected with a corresponding raised portion 11.

In some embodiments, the mask is a metal mask, and in the case where two sides of the mask are stretched by the stretcher so that the mask is attached to the substrate to be film-formed when it is in the stretched state, as shown in FIG. 2, the stretching direction (direction Z) is perpendicular to a length direction of the shielding strip 10 of the mask disposed horizontally. In this way, as shown in FIG. 3, as both the raised portion 11 and the groove 20 have the axisymmetric structures, and the axes of symmetry of the raised portion 11 and the groove 20 are coincide, the stretched stress imposed on the left and the right sides of the raised portion 11, which are symmetric along the axes of the symmetry O-O, are equal to each other when the mask is stretched, and the stresses applied to left and right sides of the raised portion 11, which are symmetric along the symmetry axis O-O, by the groove 20 are also balanced.

Figure 5:
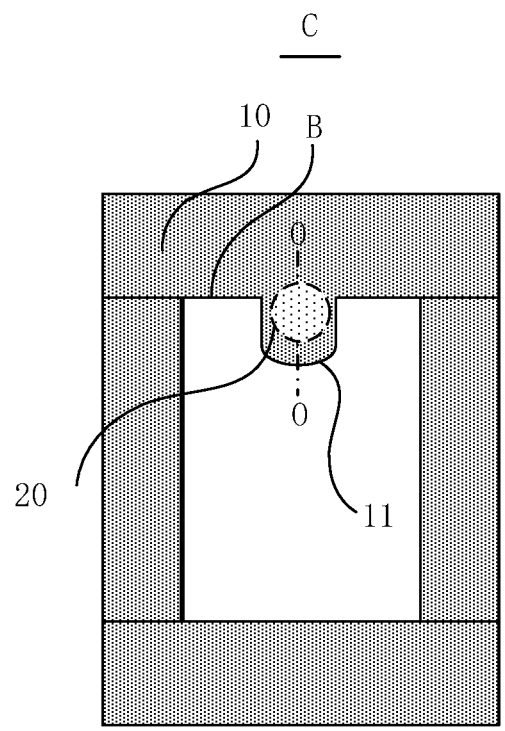
FIG. 5 is a second partial enlarged view of the region C in FIG. 2.
Figure 6:
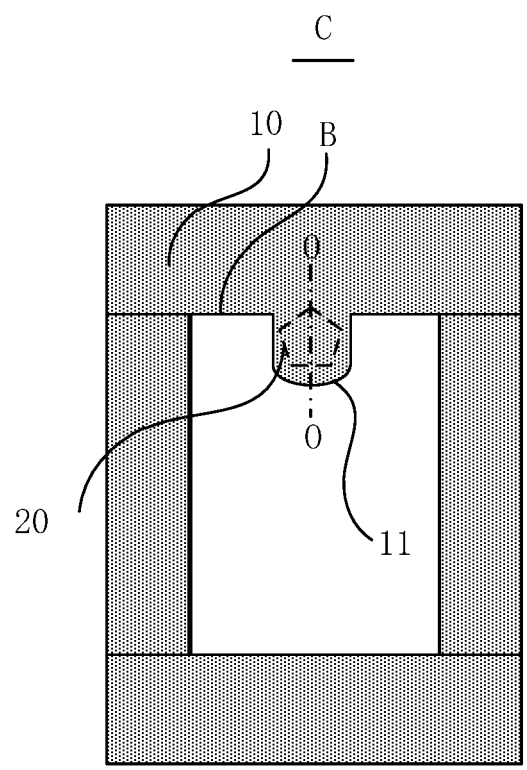
FIG. 6 is a third partial enlarged view of the region C in FIG. 2.

In some embodiments, a shape of a cross-section of the groove 20 is one of a circular shape, an elliptical shape, or a polygonal shape. For example, as shown in FIG. 3, the cross-section of the groove 20 is in a rectangle shape. For another example, as shown in FIG. 5, the cross-section of the groove 20 is in the circular shape. For another example, as shown in FIG. 6, the cross-section of the groove 20 is in a pentagon shape. For yet another example, as shown in FIG. 7, the cross-section of the groove 20 is in the elliptical shape.

The above cross-section of the groove 20 is parallel to the first surface of the raised portion 20.

Figure 7:
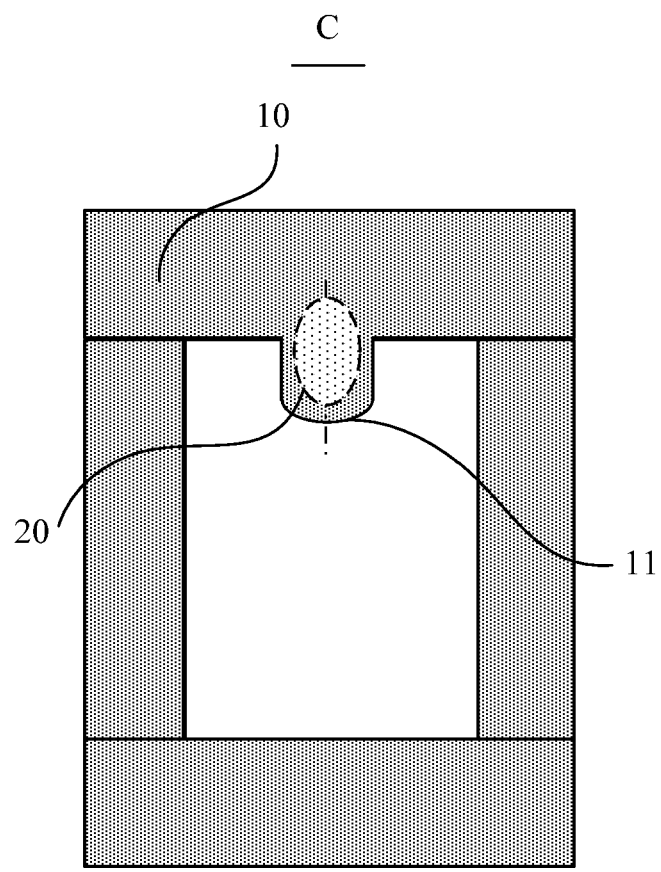
FIG. 7 is a fourth partial enlarged view of the region C in FIG. 2.

The cross-sections of the grooves 20 in FIGS. 4, and 5-7 are all axisymmetric. For example, as shown in FIG. 7, the stretched stress imposed on both sides of the raised portion 11 are equal to each other when the mask is stretched, and the stress applied to both sides of the raised portion 11 by the grooves 20 are also balanced.

Figure 8:
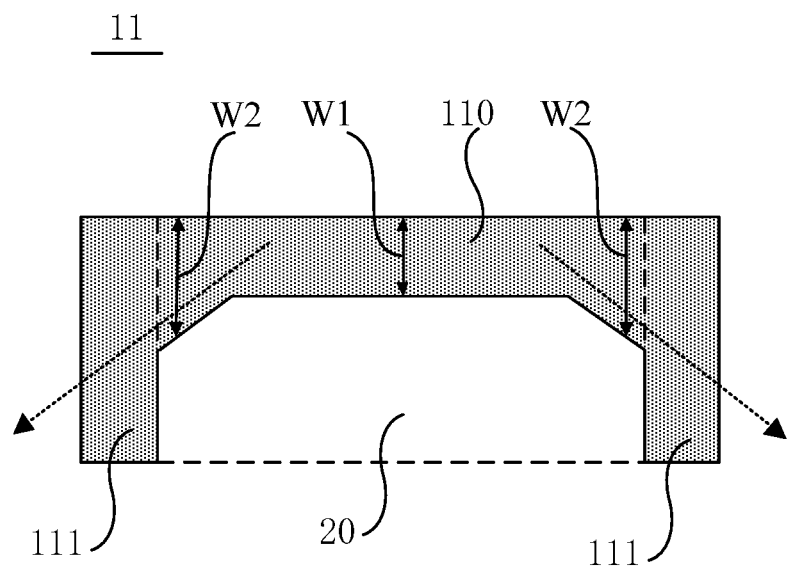
FIG. 8 is a section view of the raised portion in FIG. 3.

In addition, as shown in FIG. 8, the raised portion 11 has a bottom 110 for forming a portion of the groove 20, and a plurality of side walls 111 located on sides of the bottom 110.

A center thickness W1 of the bottom 110 is smaller than a thickness W2 of an edge of the bottom 110 adjacent to the side walls 111. In this case, when the raised portion 11 is indirectly subjected to the tensile stress transmitted through the shielding strip 10, as shown in FIG. 8, since the closer a portion of the raised portion 11 is to the center, the thinner the thickness is, and the groove 20 is disposed on the first surface of the raised portion 11 which is flush with the lower surface of the mask, the stress generated inside the raised portion 11 is in directions indicated by the arrows in FIG. 8, so that side walls 111 for forming the groove 20 are bent downward and curled under the action of the stress. Therefore, the edges of the raised portion 11 may be further attached to the substrate to be film-formed under the raised portion 11, which reduce the gap between the raised portion 11 and the substrate to be film-formed, thereby reducing the probability of the film-forming material entering into the gap during the process of vapor deposition film-forming.

Figure 9:
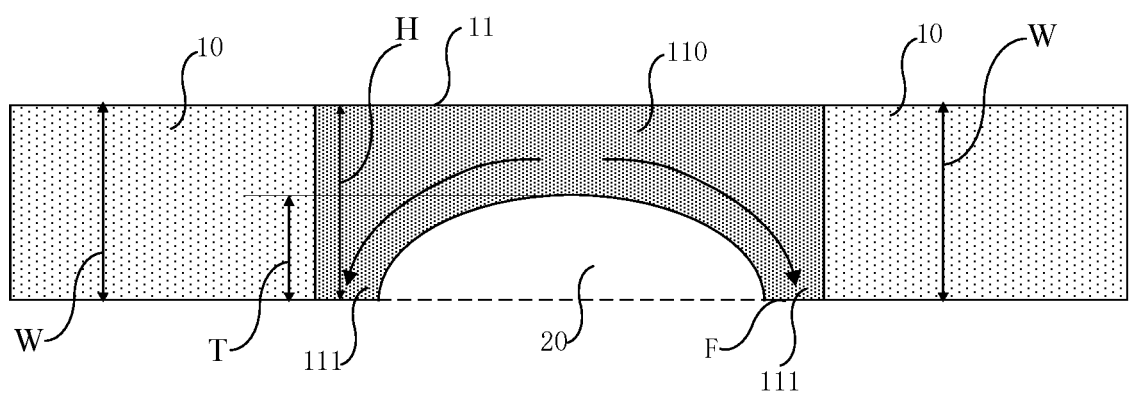
FIG. 9 is a section view of a structure including the raised portion and a portion of the shielding portion in FIG. 3.

In some embodiments, as shown in FIG. 9, a bottom surface of the groove 20 is a curved surface. In this way, when the raised portion 11 is indirectly subjected to the tensile stress transmitted through the shielding strip 10, the stress generated inside the raised portion 11 may be transmitted along the curved bottom surface for forming the groove 20 to the edges of the raised portion 11, and the raised portion 11 is stressed uniformly at all positions due to the stress transmitted along the curved surface.

In addition, in some embodiments, a ratio of an area of an orthographic projection of the groove 20 on the first surface of the raised portion 11 to an area of the first surface of the raised portion 11 is between about 1:2 and 4:5.

Figure 10:
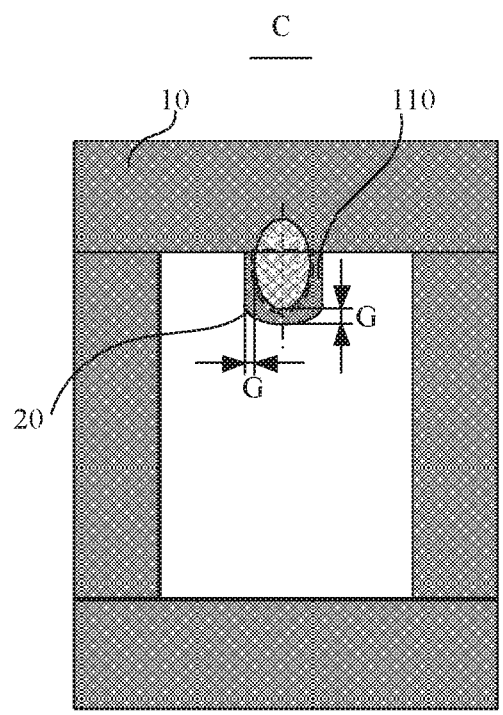
FIG. 10 is a fifth partial enlarged view of the region C in FIG. 2.

As shown in FIG. 10, by taking a portion of the groove 20 being disposed in the raised portion 11 and a remaining portion of the groove 20 being disposed in the shielding strip 10 connected with the raised portion 11 as an example, an orthographic projection of the portion of the groove 20 disposed on the raised portion 11 on the first surface of the raised portion 11 is the orthographic projection of the groove 20 on the first surface of the raised portion 11.

If the ratio of the area of the orthographic projection of the groove 20 on the first surface of the raised portion 11 to the area of the first surface of the raised portion 11 is less than ½, the stress generated in the groove 20 are applied more to the shielding strip 10 due to the configuration of the groove 20, so that the stress received by the raised portion 11 toward the substrate to be film-formed is less when being stretched, and the gap between the raised portion 11 and the substrate to be film-formed is still larger. If the ratio of the area of the orthographic projection of the groove 20 on the first surface of the raised portion 11 to the area of the first surface of the raised portion 11 is larger than 4:5, the rigidity of the entire raised portion 11 is reduced, so that the raised portion 11 is difficult to return to the original shape after being stretched, or the raised portion 11 has a risk of being fractured or damaged. Based on this, in some embodiments, the ratio of the area of the orthographic projection of the groove 20 on the first surface of the raised portion 11 to the area of the first surface of the raised portion 11 is about 3:5.

On this situation, the stress received by the raised portion 11 toward the substrate to be film-formed is less when the raised portion is stretched, and the stress transferred by the bottom surface with curved shape for forming the groove 20 along the raised portion 11 makes the raised portion 11 be subjected to the stress at each position, so that the edges of the entire raised portion 11 is toward the substrate to be film-formed, and then no large gap will be generated between each side edge of the entire raised portion 11 and the substrate to be film-formed, thereby improving the corresponding consistency between the film layer pattern corresponding to the raised portion 11 and the raised portion 11 after chemical vapor deposition film-forming.

In addition, in the case where the raised portion 11 has the bottom 110 for forming the portion of the groove 20 and a plurality of side walls 111 located on the sides of the bottom 110, and the height H of the side walls is the same as the thickness W of the shielding portion 10, in some embodiments, as shown in FIG. 9, a ratio of a depth T of the groove 20 to the thickness W of the shielding portion 10 is between about 2:5 and 9:10.

The height direction of the side wall 111 is the same as, i.e., parallel to, the thickness direction of the shielding portion 10, and the thickness direction of the shielding portion 10 is perpendicular to the upper surface and the lower surface of the mask.

It will be noted that, as shown in FIG. 4, when the longitudinal-section of the groove 20 is in a rectangle shape, the depth T of the groove 20 is the same at each position. As shown in FIG. 9, when the bottom surface of the groove 20 is a curve surface, the depth T of the groove 20 refers to the greatest measure of the straight-line distance between the bottom surface and the first surface of the raised portion 11. Furthermore, in some embodiments, the thicknesses of the shielding portion 10 are the same at each position, or the thicknesses of the shielding portion 10 are considered to be approximately the same at each position.

As shown in FIG. 9, the ratio of the depth T of the groove 20 to the thickness W of the shielding portion 10 is at least larger than about 2:5, and if the ratio is smaller than 2:5, the component stress in the generated stress along a direction toward the substrate to be film-formed is too small for the edges of the raised portion 11 to be close to substrate to be film-formed. Furthermore, the maximum ratio of the depth T of the groove 20 to the thickness W of the shielding portion 10 is about 9:10, and if the ratio is larger than 9:10, a distance between the bottom surface of the groove 20 and the surface of the mask on which no groove 20 is disposed is too small, and thus the raised portion 11 has a risk of being fractured or damaged when receiving the tensile stress, or the deformation of the raised portion 11 may not be recovered after the tensile stress is removed.

In some embodiments, the ratio of the depth T of the groove 20 to the thickness of the shielding portion 10 is about 3:5.

In this way, this arrangement not only provides a large stress component of the edges of the raised portion 11 toward the substrate to be film-formed when the mask is subjected to the stretching stress, so that the raised portion 11 generates the deformation in a direction toward the substrate to be film-formed, and then the gap between the edges of the raised portion 11 and the substrate to be film-formed is effectively reduced. In addition, since the bottom surface of the groove 20 and the side of the mask where the grooves 20 are not disposed are maintained in a reliable thickness, the risk of breakage or damage at this location during stretching may be reduced.

In addition, in the case where the raised portion 11 has a bottom 110 for forming the portion of the groove 20 and a plurality of side walls 111 located on the sides of the bottom 110, as shown in FIG. 10, a thickness G of each of the side walls 111 is larger than or equal to about 0.3 mm, so as to avoid the wall thickness G of the side wall 111 being so thin that the risk of breakage at the edges of the raised portion 11 will be increased.

It will be noted that, since the shape of the groove 20 may not be the same as the shape of the raised portion 11, the wall thickness G of the side wall 111 may not be the same at each position.

In some embodiments, the thickness G of the side walls is about 0.5 mm.

The thickness G of the side wall is set as about 0.5 mm, and such an arrangement may avoid the breakage of the edge of the raised portion 11 during the stretching of the mask, and may provide better stress value and the direction of the stress component for the edge of the raised portion 11, so that the gap between the edges of the raised portion 11 and the substrate to be film-formed is small during the process of chemical vapor deposition film-forming. Therefore, the scope of the deposition film material entering into the gap is reduced, and the consistency between the film layer pattern and the mask pattern is improved.

Figure 11:
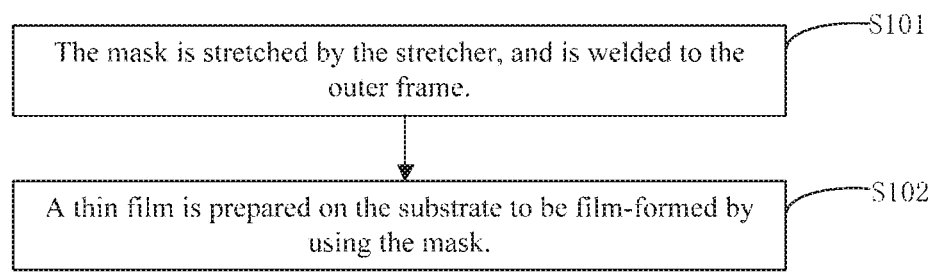
FIG. 11 is a flowchart of a film forming method in accordance with some embodiments of the present disclosure.

Some embodiments of the present disclosure provide a film-forming method, and as shown in FIG. 11, the method includes S101 and S102.

In S101, the mask provided by any one of the embodiments described above is stretched by the stretcher, and is welded to the outer frame.

In this case, the mask welded on the outer frame is attached to the substrate to be film-formed.

In S102, a thin film is prepared on the substrate to be film-formed by using the mask.

In some embodiments, in the film-forming method, forming a film layer on the substrate to be film-formed by using the mask described in any one of the above embodiments includes preparing a film layer on the substrate to be filmed under the shielding effect of the mask.

The film-forming manner of the film layer on the substrate will not be limited in the present disclosure, which is for example, chemical vapor deposition film-forming, physical vapor deposition film-forming, evaporation or doping evaporation film-forming, etc. The chemical vapor deposition method refers to, in a chemical vapor deposition apparatus, solid substances are formed through a vapor chemical reaction among the gaseous initial compound at medium or high temperatures, and the formed solid substances are deposited on the substrate to be film-formed, to form a required film layer. In the vapor chemical reaction, the vapor chemical reaction may also be aided by plasma or laser techniques, and this film-forming method may also be used to form layers of various metals, alloys, ceramics, and compounds.

In the case where a film layer is formed on the substrate to be film-formed via a chemical vapor deposition process by using the mask described above, since raised portions 11 are disposed on the mask, and the surface of each of the raised portions 11 is provided with the groove 20, when the mask is subjected to the drawing force, raised portion 11 may be better attached to the substrate to be film-formed, so as to reduce the gap between the edges of the raised portion 11 and the substrate to be film-formed, and then to reduce scope of the film-forming substance entering into the gap, thereby improving the consistency between the film layer pattern prepared by chemical vapor deposition method and the pattern of the mask.

Some embodiments of the present disclosure provide a film-forming apparatus, which includes any one of the masks described above.

The film-forming method adopted to form the film layer by the film-forming apparatus will not be limited in the present disclosure. In some embodiments, the film-forming apparatus is a chemical vapor deposition apparatus, a physical vapor deposition apparatus (such as a magnetron sputtering apparatus), or an evaporation film-forming apparatus (such as evaporation apparatus), etc.

For example, during the process of forming a film layer on the substrate to be film-formed by the chemical vapor deposition apparatus, firstly, the mask is placed close to the substrate to be film-formed as much as possible in its stretching state in the chemical vapor deposition apparatus, to reduce the gap between the edges of the mask and the substrate to be film-formed. In this process, a surface of the mask provided with the grooves 20 is placed close to the substrate to be film-formed, and in this way, since the mask is provided with the groove 20 located in whole or partly on the surface of the raised portion 11, the edges of the raised portion 11 may be bended and deformed toward the substrate to be film-formed by the stress generated on the raised portion 11. In addition, due to the stress adjustment of raised portion 11 by the groove 20, the gap between the edges of the raised portion 11 and the substrate to be film-formed is ensured to be small, and the scope of the deposition film entering into the gap is reduced, thereby enhancing the accuracy of the pattern of the film layer formed on the substrate to be film-formed.

The process of manufacturing the film layer on the substrate to be film-formed by using the mask has been described in detail in the above embodiments, which will not elaborated here.

The above description is only some embodiments of the present disclosure, but the scope of the present disclosure is not limited thereto, and any person skilled in the art can easily think of changes or replacement intended to be covered by the scope of the present disclosure within the technical scope disclosed by the present disclosure. Therefore, the scope of protection of the present disclosure should be determined by the scope of the claims.

What is claimed is:

1. A mask, comprising a shielding portion and a plurality of hollow regions, wherein the shielding portion comprises:

a plurality of shielding strips which intersect, wherein side surfaces of some of the plurality of shielding strips are sequentially connected to form one of the plurality of hollow regions;

a plurality of raised portions, each raised portion being disposed on a side surface of a corresponding shielding strips close to a corresponding hollow region, each raised portion being connected with the side surface of the corresponding shielding strip; and a plurality of grooves, the plurality of grooves being in a one-to-one correspondence to the plurality of raised portions, wherein a portion of each groove is formed in a first surface of each corresponding raised portions, and a remaining portion of each groove is formed in a surface of each corresponding shielding strip connected with and parallel to the first surface;

the first surface is parallel to a plate surface of the mask; and an orthographic projection of each groove on the plate surface overlaps not only with an orthographic projection of each corresponding raised portions on the plate surface, but also with an orthographic projection of each corresponding shielding strip on the plate surface;

each of raised portions and each groove both have axisymmetric structures, and an axis of symmetry of each raised portions coincides with an axis of symmetry of each corresponding groove;

the side surface of each corresponding shielding strip is a plane, axes of symmetry of each raised portion and each groove are perpendicular to the side surface of each corresponding shielding strip connected with each corresponding raised portion;

a ratio of an area of an orthographic projection of each groove on the first surface to an area of the first surface is about 3:5;

each raised portion has a bottom and a plurality of side walls located on sides of the bottom, the bottom is configured to form the portion of a corresponding groove which is located in the first surface of each raised portion, and a height direction of the side walls is parallel to a thickness direction of the shielding portion;

a ratio of a depth of each corresponding groove to a thickness of the shielding portion is about 3:5; and a height of the side walls and the thickness of the shielding portion are both equal to 0.5 mm.

2. The mask according to claim 1, wherein a shape of a cross-section of each groove is a polygonal shape;
the cross-section is parallel to the first surface.

3. The mask according to claim 2, wherein the polygonal shape is a rectangular shape.

4. The mask according to claim 2, wherein the polygonal shape is a pentagonal shape.

5. The mask according to claim 1, wherein
a center thickness of the bottom is smaller than a thickness of an edge of the bottom adjacent to the side walls.

6. The mask according to claim 5, wherein a bottom surface of each groove is a curved surface.

7. The mask according to claim 1, wherein a shape of a cross-section of each groove is a circular shape;
the cross-section is parallel to the first surface.

8. The mask according to claim 1, wherein a shape of a cross-section of each groove is an elliptical shape;
the cross-section is parallel to the first surface.

9. A film forming apparatus, comprising the mask according to claim 1.

10. A film forming method, comprising: preparing a thin film on a substrate by using the mask according to claim 1.

* * * * *